(12) United States Patent
Lee et al.

(10) Patent No.: US 9,480,158 B2
(45) Date of Patent: Oct. 25, 2016

(54) INTERPOSER, ELECTRONIC COMPONENT INCLUDING THE SAME, AND BOARD HAVING ELECTRONIC COMPONENT INCLUDING THE SAME

(71) Applicant: SAMSUNG ELECTRO-MECHANICS CO., LTD., Suwon-Si, Gyeonggi-Do (KR)

(72) Inventors: Soon Ju Lee, Suwon-Si (KR); Sang Soo Park, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 47 days.

(21) Appl. No.: 14/668,917

(22) Filed: Mar. 25, 2015

(65) Prior Publication Data

US 2016/0088733 A1 Mar. 24, 2016

(30) Foreign Application Priority Data

Sep. 18, 2014 (KR) .................. 10-2014-0124458

(51) Int. Cl.
| | |
|---|---|
| H05K 7/10 | (2006.01) |
| H05K 7/12 | (2006.01) |
| H05K 1/14 | (2006.01) |
| H05K 1/02 | (2006.01) |
| H05K 1/03 | (2006.01) |
| H05K 1/18 | (2006.01) |
| H05K 1/11 | (2006.01) |
| H01G 2/06 | (2006.01) |

(52) U.S. Cl.
CPC ............... *H05K 1/144* (2013.01); *H01G 2/06* (2013.01); *H05K 1/0296* (2013.01); *H05K 1/03* (2013.01); *H05K 1/111* (2013.01); *H05K 1/181* (2013.01); *H05K 2201/10015* (2013.01); *H05K 2201/10378* (2013.01)

(58) Field of Classification Search
USPC .......................................... 361/768, 767, 787
See application file for complete search history.

(56) References Cited

U.S. PATENT DOCUMENTS

| | | | | |
|---|---|---|---|---|
| 6,512,183 B2* | 1/2003 | Mitani | .................. | H05K 3/321 |
| | | | | 174/257 |
| 7,932,471 B2* | 4/2011 | Yamamoto | ............. | H01G 4/232 |
| | | | | 174/260 |
| 2011/0180317 A1 | 7/2011 | Takahashi et al. | | |
| 2013/0284507 A1 | 10/2013 | Hattori et al. | | |

FOREIGN PATENT DOCUMENTS

KR    10-2011-0043780 A    4/2011

* cited by examiner

*Primary Examiner* — Andargie M Aychillhum
(74) *Attorney, Agent, or Firm* — McDermott Will & Emery LLP

(57) ABSTRACT

There are provided an interposer, an electronic component including the same, and a board having an electronic component including the same and the interposer may include an insulating board, connective electrodes disposed on the insulating board, a concave part disposed so that when a length of a region including the insulating board and the connective electrodes is defined as L and a width thereof is defined as W, an area of the region including the insulating board and the connective electrodes on a first main surface is smaller than L×W.

11 Claims, 10 Drawing Sheets

INTERPOSER, ELECTRONIC COMPONENT INCLUDING THE SAME, AND BOARD HAVING ELECTRONIC COMPONENT INCLUDING THE SAME

CROSS-REFERENCE TO RELATED APPLICATION

This application claims the priority and benefit of Korean Patent Application No. 10-2014-0124458 filed on Sep. 18, 2014, with the Korean Intellectual Property Office, the disclosure of which is incorporated herein by reference.

BACKGROUND

The present disclosure relates to an interposer, an electronic component including the same, and a board having an electronic component including the same.

An interposer is commonly disposed between a device and a circuit board in order to mount a device such as a semiconductor, an inductor, a capacitor, or the like, on the circuit board.

In electronic components, lightness, compactness, high speed performance, multifunctionality, high performance, and high reliability are required. An important technology in implementing lightness, compactness, high speed performance, multifunctionality, high performance, and high reliability is a package technology, and a technology for an interposer is included in the package technology.

The following related art document relates to an electronic component on which fan-out is performed by an interposer, a manufacturing method thereof, and an interposer.

RELATED ART DOCUMENT (Patent Document 1) Korean Patent Laid-Open Publication No. 10-2011-0043780

SUMMARY

An aspect of the present disclosure may provide an interposer for mounting stabilization and improving adhesion strength, an electronic component including the same, and a board having an electronic component including the same.

According to an aspect of the present disclosure, an interposer may include an insulating board having first and second main surfaces opposing each other in a thickness direction, first and second side surfaces opposing each other in a width direction, and third and fourth end surfaces opposing each other in a length direction, connective electrodes disposed on the first and second main surfaces of the insulating board, and a concave part disposed so that at least one of the first and second side surfaces and the third and fourth end surfaces is indented, wherein when a length of a region including the insulating board and the connective electrodes is defined as L, and a width thereof is defined as W, the concave part is disposed so that an area of the region including the insulating board and the connective electrodes on the first main surface is smaller than L×W.

When an area of a region indented by the concave part is defined as A, A/(L×W) may satisfy $0.023 \leq A/(L \times W) \leq 0.321$, and when an area of the connective electrodes disposed on the first main surface is defined as B, B/(L×W) may satisfy $0.227 \leq B/(L \times W) \leq 0.538$.

According to another aspect of the present disclosure, an electronic component including an interposer may include a multilayer ceramic capacitor including a ceramic body including dielectric layers, first and second internal electrodes disposed in the ceramic body so as to face each other with respective dielectric layers interposed therebetween, and first and second external electrodes formed on both end portions of the ceramic body, and an interposer including an insulating board having first and second main surfaces opposing each other in a thickness direction, first and second side surfaces opposing each other in a width direction, and third and fourth end surfaces opposing each other in a length direction, first and second connective electrodes disposed on the first and second main surfaces of the insulating board so as to be connected to the first and second external electrodes on the first main surface, respectively, and a concave part disposed so that at least one of the first and second side surfaces and third and fourth end surfaces is indented, wherein when a length of a region including the insulating board and the first and second connective electrodes is defined as L, and a width thereof is defined as W, the concave part is disposed so that an area of the region including the insulating board and the first and second connective electrodes on the first main surface is smaller than L×W.

When an area of a region indented by the concave part is defined as A, A/(L×W) may satisfy $0.023 \leq A/(L \times W) \leq 0.321$, and when an area of the connective electrodes disposed on the first main surface is defined as B, B/(L×W) may satisfy $0.227 \leq B/(L \times W) \leq 0.538$.

According to another aspect of the present disclosure, a board having an electronic component including an interposer may include a multilayer ceramic capacitor including a ceramic body including dielectric layers, first and second internal electrodes disposed in the ceramic body so as to face each other with respective dielectric layers interposed therebetween, and first and second external electrodes formed on both end portions of the ceramic body, an interposer including an insulating board having first and second main surfaces opposing each other in a thickness direction, first and second side surfaces opposing each other in a width direction, and third and fourth end surfaces opposing each other in a length direction, first and second connective electrodes disposed on the first and second main surfaces of the insulating board so as to be connected to the first and second external electrodes on the first main surface, respectively, and a concave part disposed so that at least one of the first and second side surfaces and third and fourth end surfaces is indented, when a length of a region including the insulating board and the first and second connective electrodes is defined as L, and a width thereof is defined as W, the concave part being disposed so that an area of the region including the insulating board and the first and second connective electrodes on the first main surface is smaller than L×W, and a board including a first board electrode connected to the first connection electrode on the second main surface and a second board electrode connected to the second connection electrode on the second main surface.

When an area of a region indented by the concave part is defined as A, A/(L×W) may satisfy $0.023 \leq A/(L \times W) \leq 0.321$, and when an area of the connective electrodes disposed on the first main surface is defined as B, B/(L×W) may satisfy $0.227 \leq B/(L \times W) \leq 0.538$.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
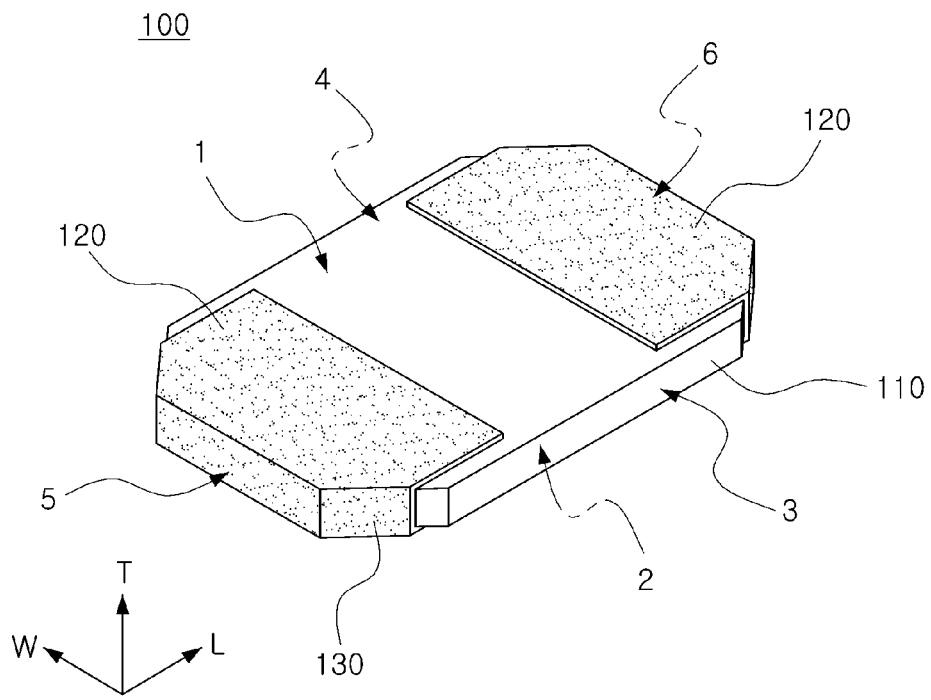
FIG. 1 is a perspective view of an interposer according to a first exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Interposer

Figure 2:
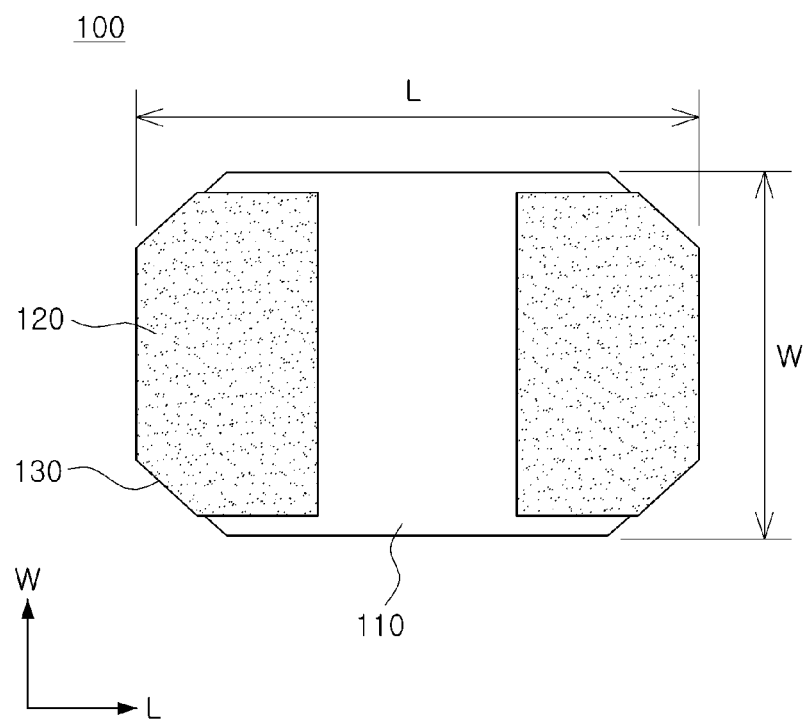
FIG. 2 is a plan view of the interposer of FIG. 1.

FIG. 1 is a perspective view of an interposer 100 according to a first exemplary embodiment of the present disclosure, and FIG. 2 is a plan view of the interposer 100 of FIG. 1.

Referring to FIG. 1, the interposer 100 according to a first exemplary embodiment of the present disclosure may include an insulating board 110 having first and second main surfaces 1 and 2 opposing each other in a thickness direction, first and second side surfaces 3 and 4 opposing each other in a width direction, and third and fourth end surfaces 5 and 6 opposing each other in a length direction; connective electrodes 120 disposed on the first and second main surfaces 1 and 2 of the insulating board 110; and a concave part 130 disposed so that at least one of the first and second side surfaces 3 and 4 and the third and fourth end surfaces 5 and 6 are indented, wherein when a length of a region including the insulating board 110 and the connection electrode 120 is defined as L, and a width thereof is defined as W, the concave part 130 is disposed so that an area of the region including the insulating board 110 and the connection electrode 120 on the first main surface is smaller than L×W.

The interposer 100 may be positioned between a board and a device to serve to electrically connect the board and the device to each other.

The interposer 100 may have a thin plate shape. An "L direction" may refer to the "length direction", a "W direction" may refer to the "width direction" and a "T direction" may refer to the "thickness direction". The thickness direction is a direction in which a board, the interposer 100, and a device are mounted in the case in which the device is connected to the interposer 100 and then mounted on the board.

In the interposer 100, surfaces opposing each other in the thickness direction may be defined as first and second main surfaces, surfaces opposing each other in the width direction may be defined as first and second side surfaces, and surfaces opposing each other in the length direction may be defined as third and fourth end surfaces.

The interposer 100 may include the insulating board 110 and the connection electrode 120 disposed on upper and lower surfaces of the insulating board. In the insulating board, surfaces opposing each other in the thickness direction may be defined as the first and second main surfaces 1 and 2, surfaces opposing each other in the width direction may be defined as first and second side surfaces 3 and 4, and surfaces opposing each other in the length direction may be defined as third and fourth end surfaces 5 and 6, similarly to the interposer 100. Therefore, the upper and lower surfaces of the insulating board on which the connection electrode 120 is disposed may correspond to the first and second main surfaces.

As shown in FIG. 1, the interposer 100 may include two connective electrodes 120, and these connective electrodes 120 may be connected to different power sources, respectively. Therefore, the insulating board 110 included in the interposer 100 needs to be formed of a material having an electric insulation property. To this end, the insulating board 110 may contain ceramic or a resin, but the present disclosure is not limited thereto.

The connection electrode 120 included in the interposer 100 may be formed of a conductive material. A portion of the connection electrode 120 disposed on the first main surface of the interposer 100 may be connected to an electrode of the device, and a portion thereof disposed on the second main surface of the interposer 100 may be connected to an electrode of the board. In order to allow the device and the board to be electrically connected to each other through the connection electrode 120, the connection electrode 120 may be extended to at least one of the first and second side surfaces and the third and fourth end surfaces of the insulating board 110. Further, in order to connect the portions of the connection electrode 120 disposed on the first and second main surfaces to each other, a via hole is drilled in the insulating board 110 to dispose a via electrode, but the present disclosure is not limited thereto.

The interposer 100 according to an exemplary embodiment of the present disclosure may include the concave part 130 disposed so that the first and second side surfaces or the third and fourth end surfaces become caved. More specifically, in the interposer 100 including the insulating board 110 and the connection electrode 120, a rectangle of which a length of one side on the first main surface of the interposer 100 is L and a length of the other side is W may be defined by defining a length of the first main surface of the interposer 100 as L and defining a width thereof as W. A portion of the interposer 100 caved so that an area of the interposer 100 is smaller than an area of the rectangle may correspond to the concave part 130. In other words, the concave part 130 may correspond to a portion disposed so that at least one of the first and second side surfaces or the third and fourth end surfaces of the interposer 100 is disposed to be caved, and accordingly, the area of the region including the insulating board 110 and the connection electrode 120 on the first main surface is smaller than L×W.

The interposer 100 may be positioned between a board and a device to serve to electrically connect the board and the device to each other. To this end, after an adhesive such as solder, or the like, is formed on the board, the interposer 100 and the device may be disposed to thereby be adhered thereto. In order to stably fix the interposer 100 and the device to the board, a contact area between the adhesive such as the solder, or the like, and the interposer 100 and the device needs to be sufficiently wide.

In the case of an interposer 100 that does not include a concave part 130 according to the related art, in order to allow the adhesive such as the solder, or the like, to sufficiently come in contact with the device, the adhesive is allowed to move along a side surface of the device. Since a lower surface of the device comes in contact with an upper surface of the interposer 100, in order to obtain sufficient adhesion strength, a large amount of the adhesive such as the solder, or the like, should be allowed to move along the side surface of the device. However, in the case of applying a large amount of the adhesive such as the solder, or the like, in order to improve adhesion strength, a phenomenon that the interposer 100 and the device are misaligned may be generated at the time of being mounted. In addition, when the adhesive is bonded only to the side surface of the device, a bonding area is restrictive, such that there is a limitation in obtaining sufficient adhesion strength.

The interposer 100 according to an exemplary embodiment of the present disclosure may include the concave part 130. Since the adhesive such as the solder, or the like, may be formed on an empty region formed by the concave part 130, the adhesive such as the solder, or the like, may be bonded to the lower surface of the device, such that the bonding area may be increased, which may increase mounting strength of the interposer 100 and the device. Further, in the case in which the adhesive such as the solder, or the like, are excessively injected on the board, since the adhesive such as the solder, or the like is disposed in the empty region formed by the concave part 130, an amount of the adhesive moving along the side surface of the device may be small. Therefore, the interposer 100 and the device may be stably mounted while having sufficient adhesion strength.

Figure 3:
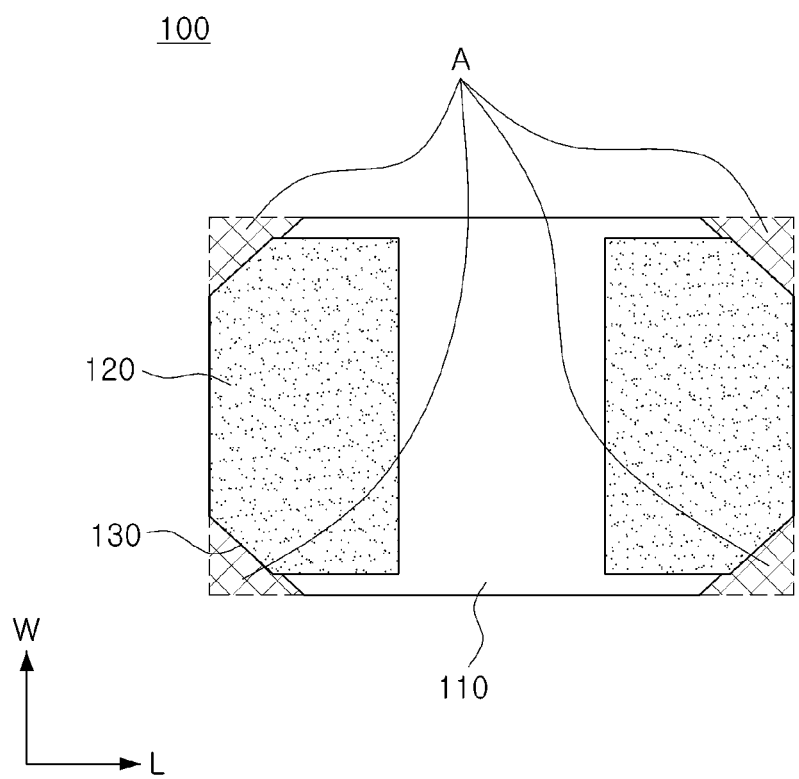
FIG. 3 is a plan view indicating an area A in a cross-sectional view of the interposer of FIG. 2.

FIG. 3 is a plan view indicating an area A in FIG. 2, which is a cross-sectional view of the interposer 100.

Referring to FIG. 3, when an area of a region indented by the concave part 130 is defined as A, the interposer 100 according to an exemplary embodiment of the present disclosure may satisfy $0.023 \leq A/(L \times W) \leq 0.321$.

As described above, when the rectangle of which the length of one side is L and the length of the other side is W is defined, the area of the region indented by the concave part 130 may be defined as A. In other words, A is a value obtained by subtracting an area of the first main surface of the interposer 100 from L×W, which is an area of the rectangle.

When $A/(L \times W)$ is less than 0.023, since the empty region formed by the concave part 130 is small, a large amount of the adhesive such as the solder, or the like, may be disposed on lower portions of the device and the interposer 100, and accordingly, an amount of the adhesive moving along the side surface of the device may also be increased, such that amounting defect may occur. When $A/(L \times W)$ is more than 0.321, since the adhesive such as the solder, or the like, may be disposed only at the empty region formed by the concave part 130 and accordingly, the adhesive may not be bonded to the device through the side surface of the device, adhesion strength may be decreased, such that the electrode of the device, the connection electrode 120 of the interposer 100, or the like, may be delaminated or sheared. Therefore, in the case in which $A/(L \times W)$ satisfies $0.023 \leq A/(L \times W) \leq 0.321$, the interposer 100 having excellent mounting stability and adhesion strength may be obtained.

Figure 4:
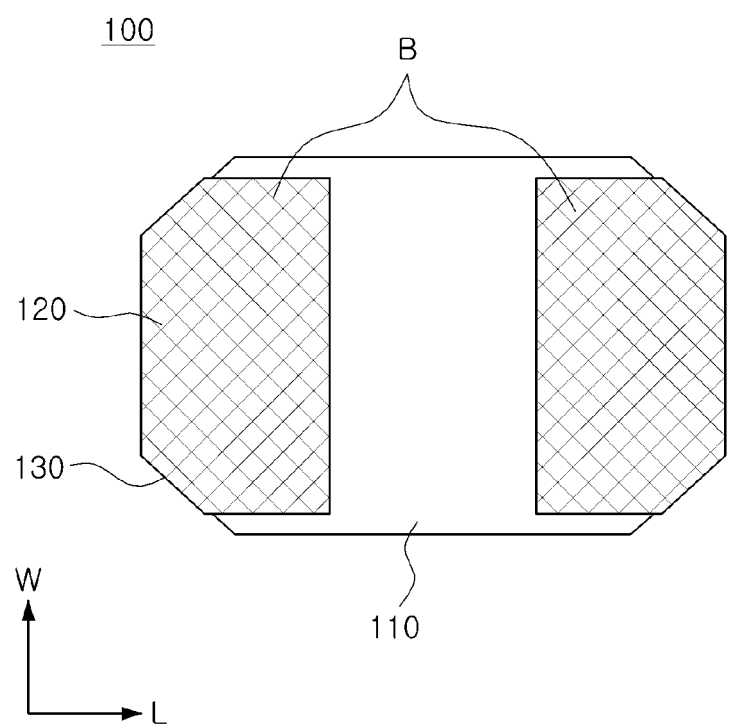
FIG. 4 is a plan view indicating an area B in the cross-sectional view of the interposer of FIG. 2.

FIG. 4 is a plan view indicating an area B in FIG. 2, which is the cross-sectional view of the interposer 100.

Referring to FIG. 4, when an area of the connection electrode 120 disposed on the first main surface is defined B, the interposer 100 according to an exemplary embodiment of the present disclosure may satisfy $0.227 \leq B/(L \times W) \leq 0.538$.

As shown in FIG. 4, B is the area of the connection electrode 120 disposed on the first main surface of the interposer 100.

When $B/(L \times W)$ is less than 0.227, since a bonding area between the connection electrode 120 of the interposer and the adhesive such as the solder, or the like, on the board is decreased, adhesion strength may be decreased, such that the electrode of the device, the connection electrode 120 of the interposer 100, or the like, may be delaminated or sheared. When $B/(L \times W)$ is more than 0.538, since the empty region formed by the concave part 130 is small, a large amount of the adhesive such as the solder, or the like, may be disposed on the lower portions of the device and the interposer 100, and accordingly, an amount of the adhesive moving along the side surface of the device may also be increased, such that the mounting defect may occur. Therefore, in the case in which $B/(L \times W)$ satisfies $0.0227 \leq B/(L \times W) \leq 0.538$, the interposer 100 having excellent mounting stability and adhesion strength may be obtained.

Table 1 shows results obtained by measuring mounting defect rates and adhesion strength of electronic components depending on changes in $A/(L \times W)$ and $B/(L \times W)$ of the interposer 100 in Inventive Examples and Comparative Examples of the present disclosure.

A thickness of the interposer 100 used in Inventive Examples and Comparative Examples of Table 1 was 0.1 to 0.16 mm, the device was a multilayer ceramic capacitor (MLCC) having a length of 1.0 to 1.6 mm, and the board was a FR-4 printed circuit board (PCB) having a thickness of 1.6 mm. The multilayer ceramic capacitor, the interposer 100, and the board were bonded to each other by reflowing the solder at 255.

The mounting defect rate was measured and judged by measuring electric capacitance of the multilayer ceramic capacitor bonded to the board. In the case in which the mounting of the multilayer ceramic capacitor is defective, even though a voltage is applied, electric properties are not exhibited due to electrode short-circuit, or the like, such that electric capacitance is not measured. Therefore, the mounting defect rate of Table 1 indicates a percentage of the multilayer ceramic capacitor of which electric capacitance was not measured.

Adhesion strength was measured and evaluated by observing whether or not external electrodes of the multilayer ceramic capacitor and the connection electrode 120 of the interposer 100 were delaminated and whether or not they were sheared when force of 500 gf was applied to one side surface of the multilayer ceramic capacitor bonded to the board for 10 seconds. In Table 1, the case in which the external electrodes and the connection electrode 120 were not delaminated and sheared was represented as GOOD, and the case in which the external electrodes and the connection electrode 120 were delaminated or sheared was represented as NG.

Figure 5:
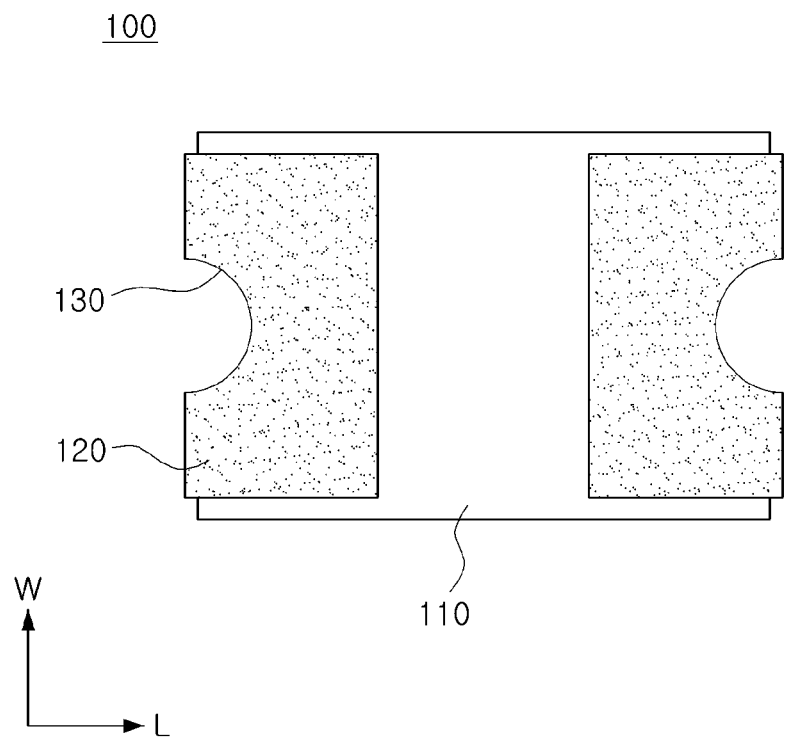
FIG. 5 is a plan view of an interposer according to a second exemplary embodiment of the present disclosure.
Figure 6:
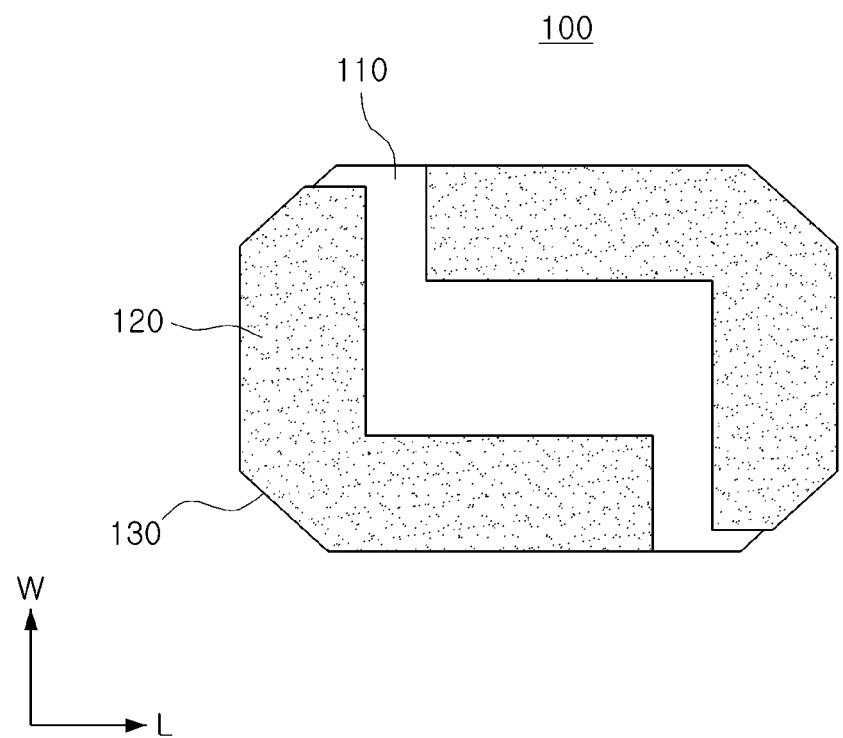
FIG. 6 is a plan view of an interposer according to a third exemplary embodiment of the present disclosure.

FIG. 5 is a plan view of an interposer 100 according to a second exemplary embodiment of the present disclosure, and FIG. 6 is a plan view of an interposer 100 according to a third exemplary embodiment of the present disclosure.

As shown in FIGS. 1 and 2, the concave part 130 included in the interposer 100 may be disposed at at least one corner of the insulating board 110, and the connective electrodes 120 may be disposed to be spaced apart from each other at

TABLE 1

| Number | L (mm) | W (mm) | A (mm$^2$) | B (mm$^2$) | A/(L × W) | B/(L × W) | Mounting Defect Rate (%) | Adhesion Strength Measurement |
|---|---|---|---|---|---|---|---|---|
| Comparative Example 1 | 1.182 | 0.678 | 0.000 | 0.442 | 0.000 | 0.552 | 5 | GOOD |
| Comparative Example 2 | 1.180 | 0.687 | 0.010 | 0.444 | 0.012 | 0.548 | 5 | GOOD |
| Comparative Example 3 | 1.179 | 0.681 | 0.016 | 0.436 | 0.020 | 0.543 | 4 | GOOD |
| Inventive Example 1 | 1.186 | 0.687 | 0.019 | 0.438 | 0.023 | 0.538 | 0 | GOOD |
| Inventive Example 2 | 1.185 | 0.677 | 0.040 | 0.420 | 0.050 | 0.524 | 0 | GOOD |
| Inventive Example 3 | 1.179 | 0.682 | 0.170 | 0.322 | 0.311 | 0.400 | 0 | GOOD |
| Inventive Example 4 | 1.176 | 0.680 | 0.252 | 0.280 | 0.315 | 0.350 | 0 | GOOD |
| Inventive Example 5 | 1.787 | 0.985 | 0.299 | 0.718 | 0.170 | 0.408 | 0 | GOOD |
| Inventive Example 6 | 1.786 | 0.968 | 0.387 | 0.594 | 0.224 | 0.344 | 0 | GOOD |
| Inventive Example 7 | 1.772 | 0.976 | 0.556 | 0.392 | 0.321 | 0.227 | 0 | GOOD |
| Comparative Example 4 | 1.787 | 0.977 | 0.578 | 0.385 | 0.331 | 0.321 | 0 | NG |
| Comparative Example 5 | 1.779 | 0.969 | 0.643 | 0.306 | 0.373 | 0.178 | 0 | NG |

In Comparative Examples 1 to 3 corresponding to the cases in which A/(L×W) was less than 0.023, and B/(L×W) was more than 0.538, the mounting defect of the multilayer ceramic capacitor occurred. As described above, since the empty region formed by the concave part 130 is small, a large amount of the adhesive such as the solder, or the like, may be disposed on lower portions of the device and the interposer 100, and accordingly, an amount of the adhesive moving along the side surface of the device may also be increased, such that a mounting defect may occur.

In Comparative Examples 4 and 5 corresponding to the cases in which A/(L×W) was more than 0.321, and B/(L×W) was less than 0.227, at the time of measuring adhesion strength, delamination of the external electrodes and the connection electrode of the multilayer ceramic capacitor was observed or a phenomenon that the multilayer ceramic capacitor was misaligned occurred. As described above, since the adhesive such as the solder, or the like, is disposed only on the empty region formed by the concave part 130 and accordingly, the adhesive may not be bonded to the device through the side surface of the device, the bonding area may be decreased, and a bonding area between the connection electrode 120 of the interposer and the adhesive such as the solder, or the like, on the board may also be decreased, such that adhesion strength may be decreased.

In Inventive Examples 1 to 7 corresponding to the cases in which A/(L×W) satisfied 0.023≤A/(L×W)≤0.321 and B/(L×W) satisfied 0.227≤B/(L×W)≤0.538, the multilayer ceramic capacitor was preferably mounted, such that electric capacitance was measured, and delamination of the external electrodes and the connection electrode or misalignment of the multilayer ceramic capacitor did not occur.

the third and fourth end surfaces of the interposer 100. The interposer 100 according to an exemplary embodiment of the present disclosure is not limited thereto.

Referring to FIG. 5, a concave part 130 may be disposed at at least one of first and second side surfaces and third and fourth end surfaces of the interposer 100, and referring to FIG. 6, the connective electrodes 120 may be extended to first and second side surfaces of the interposer 100.

As described above, shapes and disposition of the concave part 130 and the connection electrode 120 may be variously changed depending on the kinds of device to be mounted and adhesive, and the like.

Electronic Component Including Interposer

Hereinafter, an electronic component 200 including an interposer 220 according to another exemplary embodiment of the present disclosure will be described.

Figure 7:
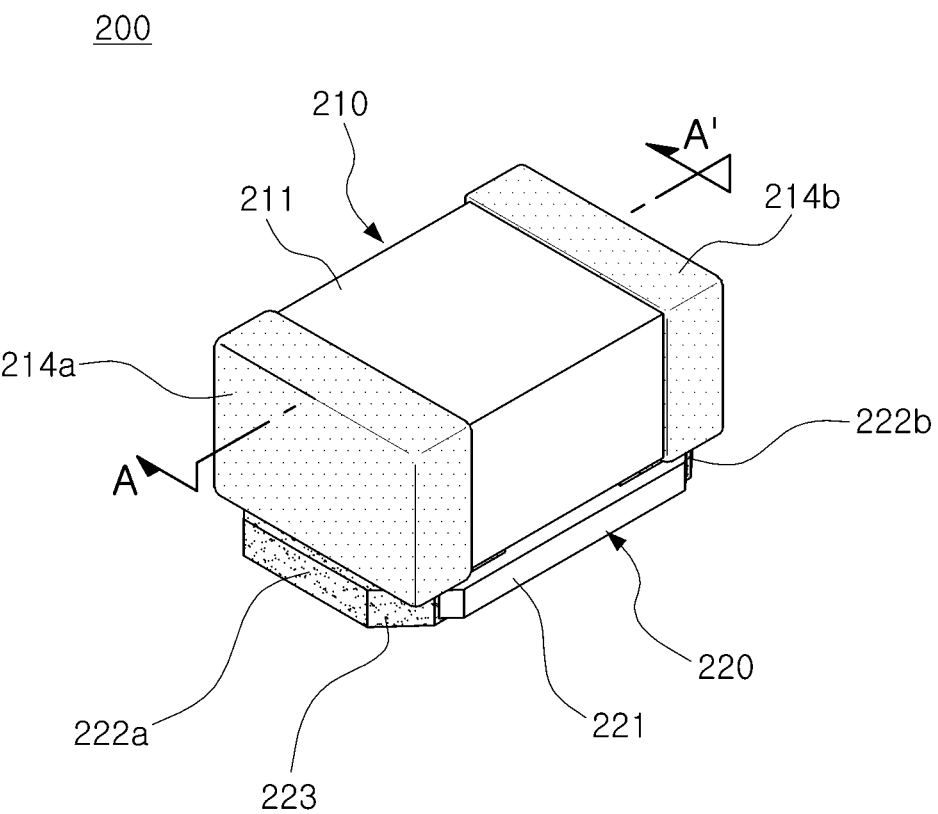
FIG. 7 is a perspective view of an electronic component including an interposer according to a fourth exemplary embodiment of the present disclosure.
Figure 8:
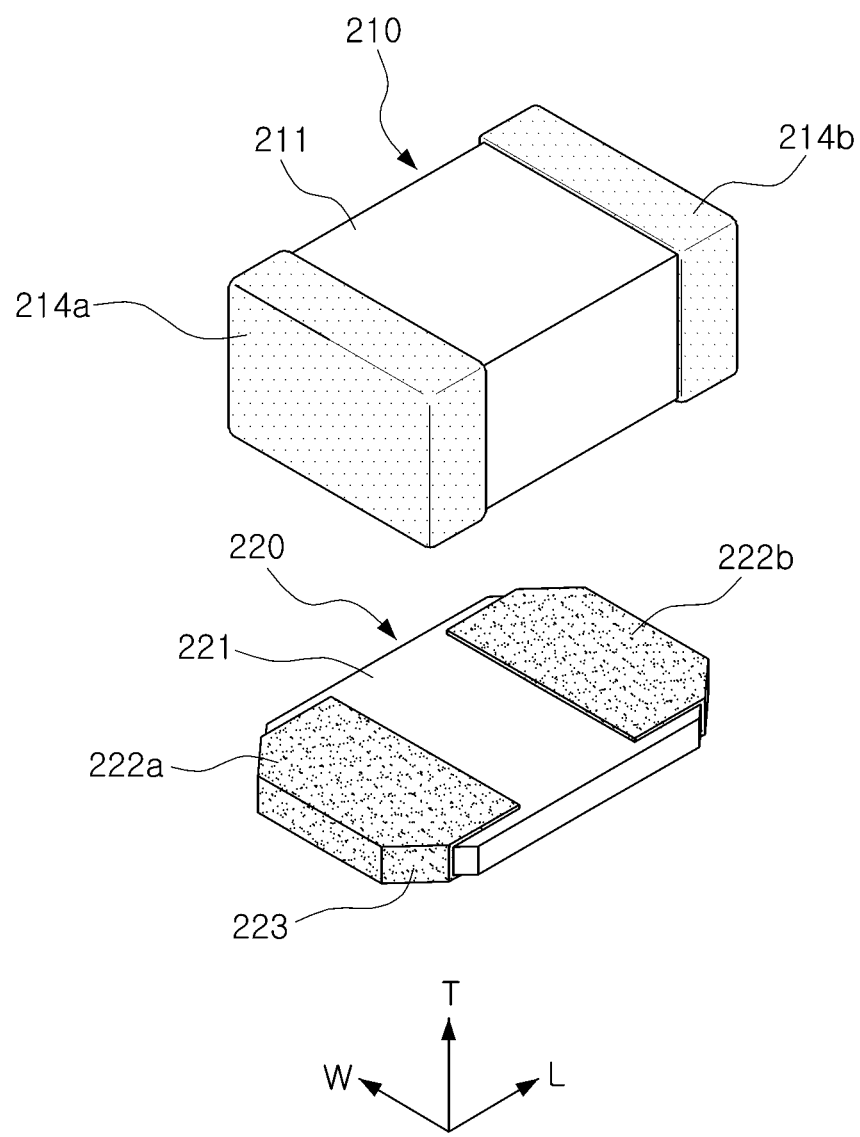
FIG. 8 is an exploded perspective view of the electronic component including an interposer of FIG. 7.

FIG. 7 is a perspective view of an electronic component 200 including an interposer 220 according to a fourth exemplary embodiment of the present disclosure; FIG. 8 is an exploded perspective view of the electronic component 200 including an interposer 220 of FIG. 7, and FIG. 9 is a cross-sectional view of the electronic component 200 including an interposer 200, taken along line A-A' of FIG. 7.

Figure 9:
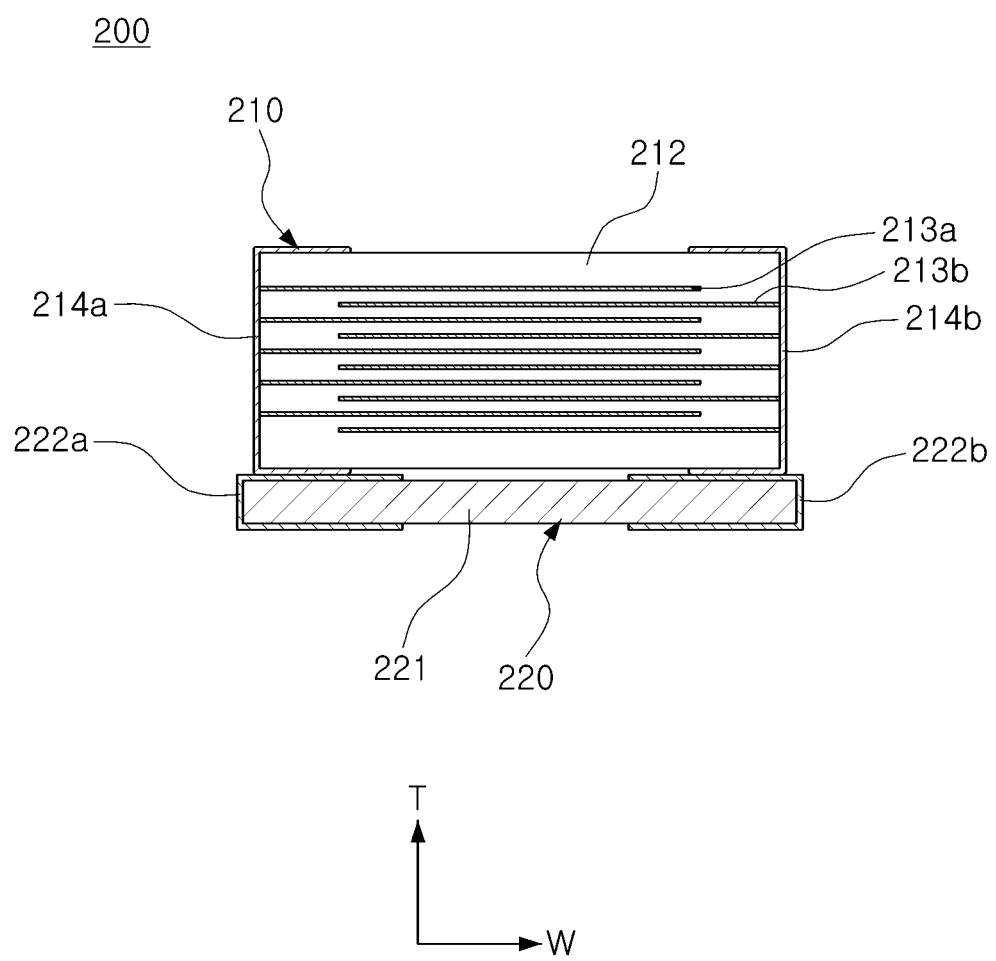
FIG. 9 is a cross-sectional view of the electronic component including an interposer, taken along line A-A' of FIG. 7.

Referring to FIGS. 7 through 9, the electronic component including an interposer 200 according to a fourth exemplary embodiment of the present disclosure may include: a multilayer ceramic capacitor 210 including a ceramic body 211 including dielectric layers 212, first and second internal electrodes 213a and 213b disposed in the ceramic body 211 so as to face each other with each of the dielectric layers 212 interposed therebetween, and first and second external electrodes 214a and 214b formed on both end portions of the ceramic body 211; and an interposer 220 including an insulating board 221 having first and second main surfaces opposing each other in a thickness direction, first and second side surfaces opposing each other in a width direction, and third and fourth end surfaces opposing each other in a length direction, first and second connective electrodes 222a and 222b disposed on the first and second main surfaces of the insulating board 221 so as to be connected to the first and second external electrodes 214a and 214b on the first main surface, respectively, and a concave part 223 disposed so that at least one of the first and second side surfaces and third and fourth end surfaces are indented, wherein when a length of a region including the insulating board 221 and the first and second connective electrodes 222a and 222b is defined as L, and a width thereof is defined as W, the concave part 223 is disposed so that an area of the region including the insulating board 110 and the first and second connective electrodes 222a and 222b on the first main surface is smaller than L×W.

A device coupled to and mounted on the interposer 220 may be various, and examples thereof may include a multilayer ceramic capacitor, a semiconductor device, a R-HMC, or the like, but the present disclosure is not limited thereto. The electronic component 200 including the multilayer ceramic capacitor 210 is shown in FIGS. 7 through 9, but the above-mentioned various devices may be included.

The multilayer ceramic capacitor 210 according to the present exemplary embodiment may include the ceramic body 211, the dielectric layers 212, the first and second external electrodes 214a and 214b, and the first and second internal electrodes 213a and 213b.

The ceramic body 211 of the multilayer ceramic capacitor 210 may be formed by applying a conductive paste on ceramic green sheets so as to form the first and second internal electrodes 213a and 213b, stacking the ceramic green sheets on which the first and second internal electrodes 213a and 213b are formed, and then sintering the stacked ceramic green sheets. The multilayer ceramic capacitor 210 may be manufactured by forming the first and second external electrodes 214a and 214b on an outer portion of the ceramic body 211 so as to be electrically connected to the first and second internal electrodes 213a and 213b, respectively.

Referring to FIGS. 7 through 9, the multilayer ceramic capacitor 210 may be mounted on the interposer 220. The first and second external electrodes 214a and 214b of the multilayer ceramic capacitor 210 may be connected to the first and second connective electrodes 222a and 222b disposed on an upper surface of the interposer 220, respectively.

The interposer 220 included in the electronic component 220 including an interposer 220 according to the present exemplary embodiment may include the concave part 223.

As described above, when q rectangle of which a length of one side is L and a length of the other side is W is defined, an area of a region indented by the concave part 223 may be defined as A. In other words, A is a value obtained by subtracting an area of the first main surface of the interposer 220 from L×W, which is an area of the rectangle.

When $A/(L \times W)$ is less than 0.023, since an empty region formed by the concave part 223 is small, a large amount of an adhesive such as solder, or the like, may be disposed on lower portions of the device and the interposer 220, and accordingly, an amount of the adhesive moving along a side or end surface of the device may be increased, such that a mounting defect may occur. When $A/(L \times W)$ is more than 0.321, since the adhesive such as the solder, or the like, may be disposed only at the empty region formed by the concave part 223, and may not be bonded to the device through the side or end surface of the device, adhesion strength may be decreased, such that the electrode of the device, the first and second connective electrodes 222a and 222b of the interposer 220, or the like, may be delaminated or sheared. Therefore, in the case in which $A/(L \times W)$ satisfies $0.023 \leq A/(L \times W) \leq 0.321$, the interposer 220 having excellent mounting stability and adhesion strength may be obtained.

In addition, an area of the first and second connective electrodes 222a and 222b disposed on the first main surface of the interposer 220 may be defined as B.

When $B/(L \times W)$ is less than 0.227, since a bonding area between the first and second connective electrodes 222a and 222b of the interposer 220, and the adhesive such as the solder, or the like, on the board is decreased, adhesion strength may be decreased, such that the electrode of the device, the first and second connective electrodes 222a and 222b of the interposer 220, or the like, may be delaminated or sheared. When $B/(L \times W)$ is more than 0.538, since an empty region formed by the concave part 223 is small, a large amount of an adhesive such as solder, or the like, may be disposed on lower portions of the device and the interposer 220, and accordingly, an amount of the adhesive moving along the side or end surface of the device may be increased, such that the mounting defect may occur. Therefore, in the case in which $B/(L \times W)$ satisfies $0.0227 \leq B/(L \times W) \leq 0.538$, the interposer 220 having excellent mounting stability and adhesion strength may be obtained.

A detailed description of $0.023 \leq A/(L \times W) \leq 0.321$ and $0.227 \leq B/(L \times W) \leq 0.538$ will be omitted in order to avoid an overlapped description.

Board Having Electronic Component Including Interposer

Hereinafter, a board 300 having an electronic component including an interposer 320 according to another exemplary embodiment of the present disclosure will be described.

Figure 10:
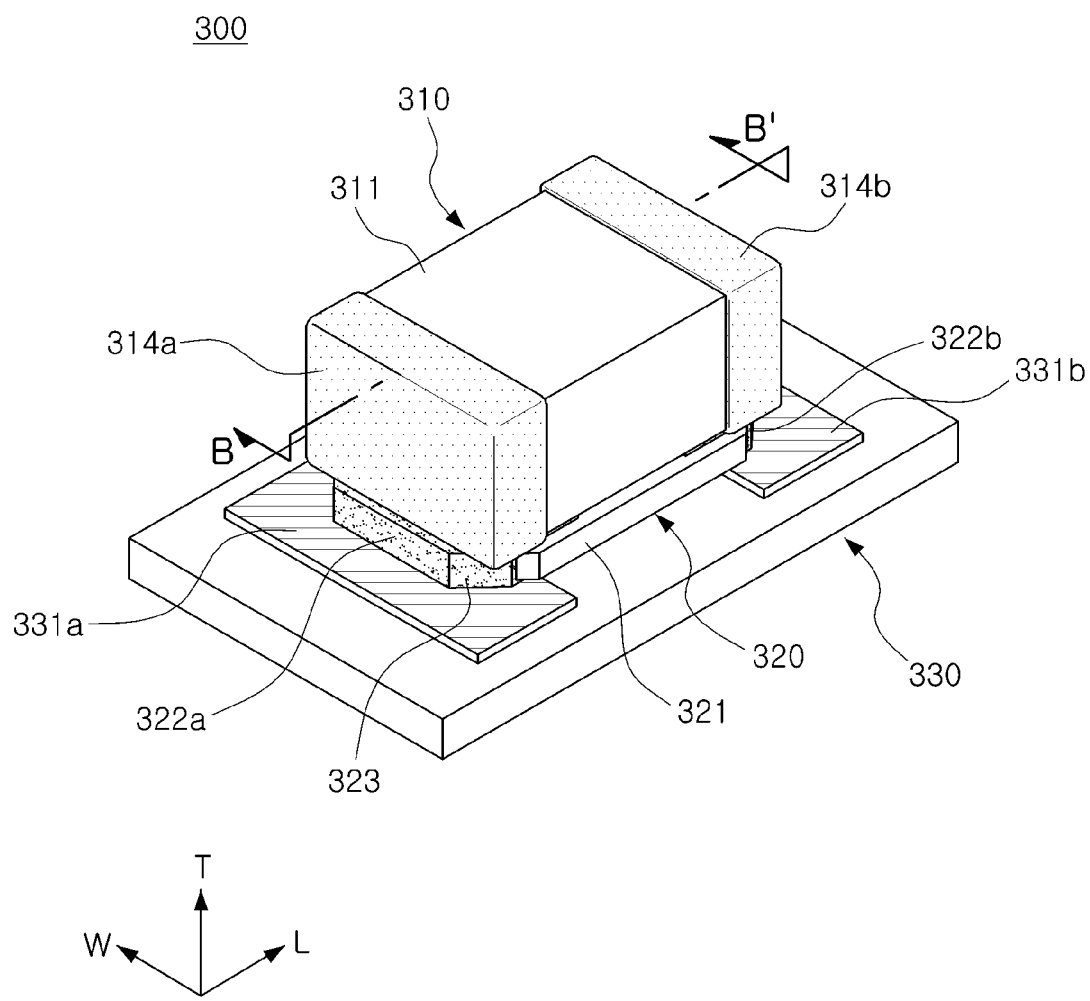
FIG. 10 is a perspective view of a board having an electronic component including an interposer according to a fifth exemplary embodiment of the present disclosure.
Figure 11:
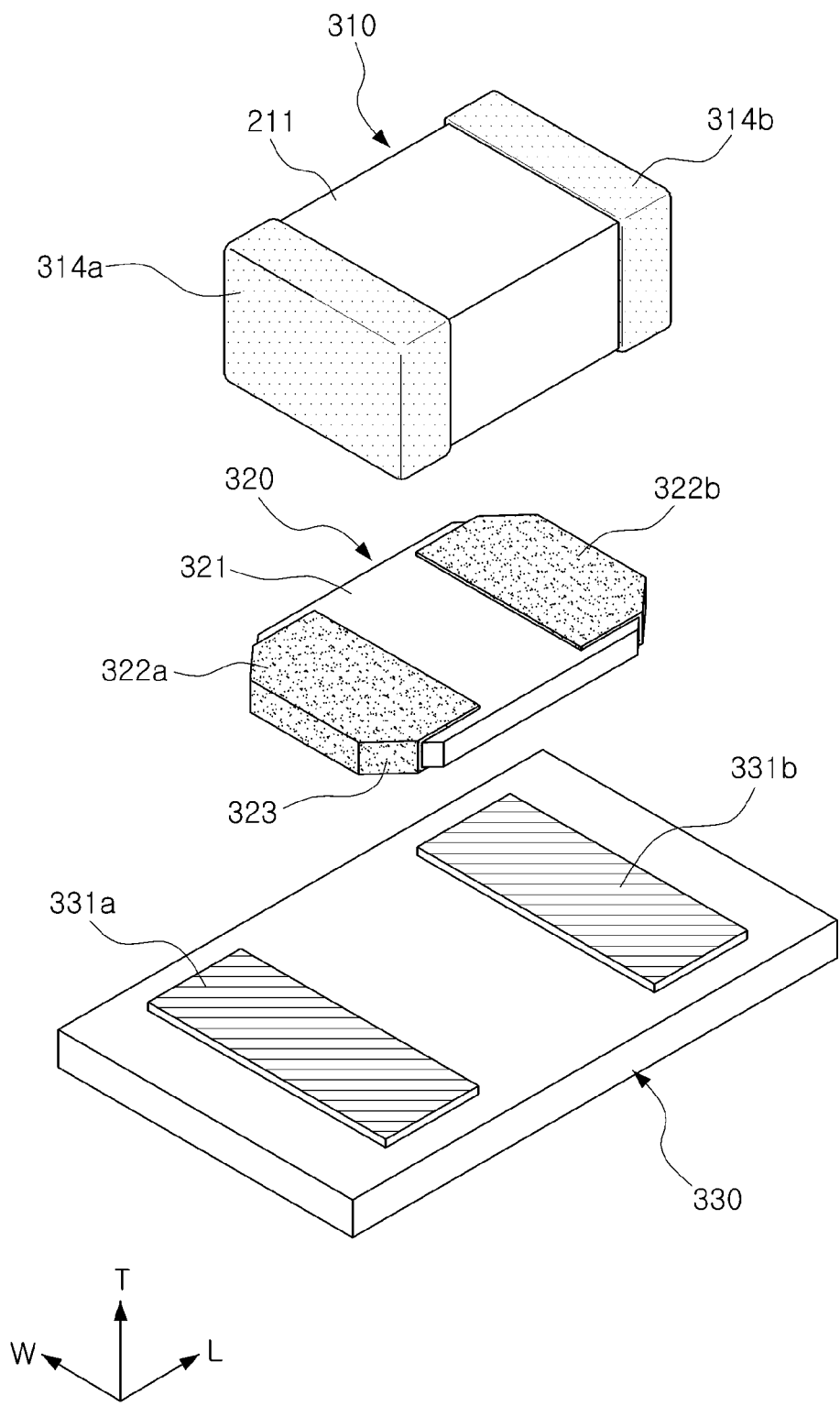
FIG. 11 is an exploded perspective view of the board having an electronic component including an interposer of FIG. 10.
Figure 12:
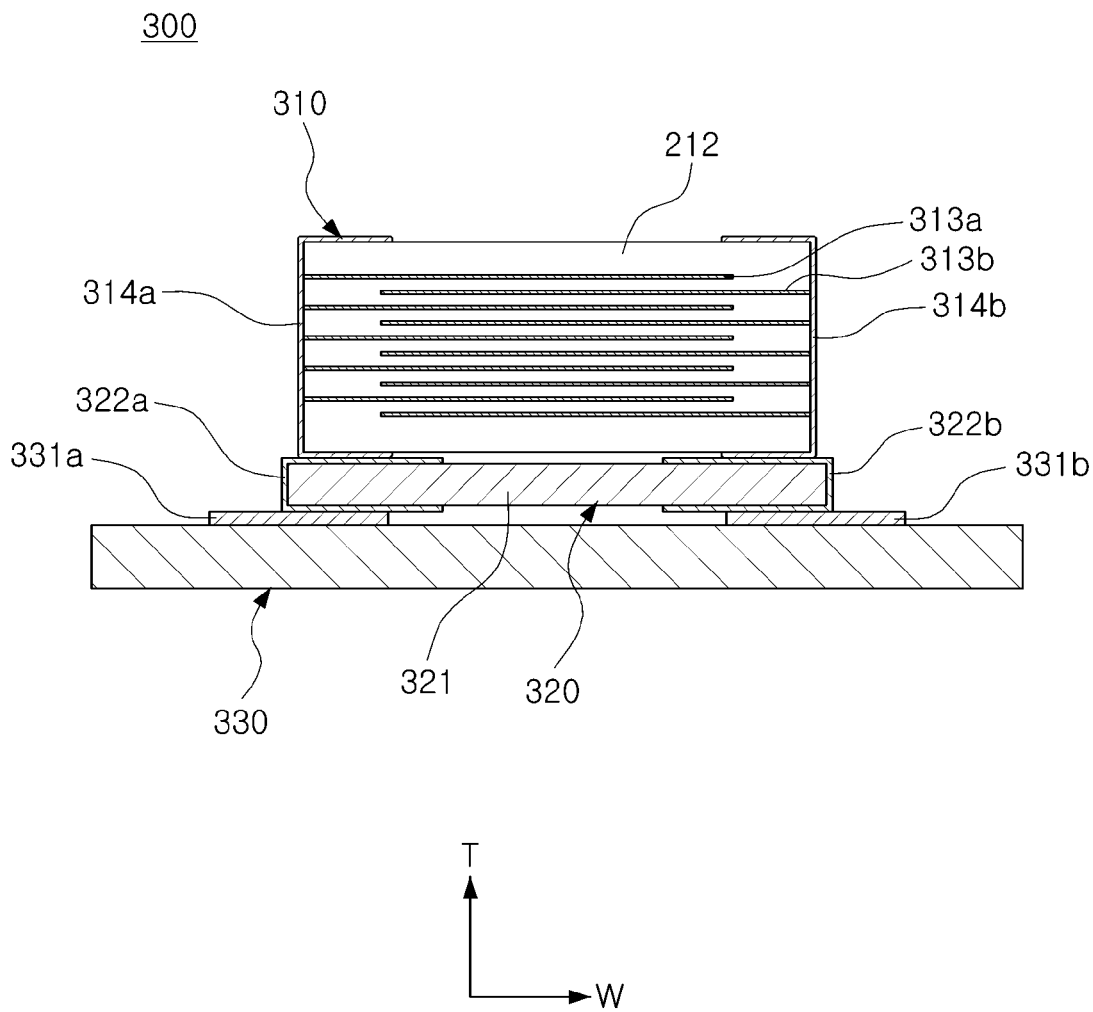
FIG. 12 is a cross-sectional view of the board having an electronic component including an interposer, taken along line B-B' of FIG. 10.

FIG. 10 is a perspective view of a board 300 having an electronic component including an interposer 320 according to a fifth exemplary embodiment of the present disclosure, FIG. 11 is an exploded perspective view of the board 300 having an electronic component including an interposer 320 of FIG. 10, and FIG. 12 is a cross-sectional view of the board 300 having an electronic component including an interposer 320, taken along line B-B' of FIG. 10.

Referring to FIGS. 10 through 12, the board 300 having an electronic component including an interposer 320 according to a fifth exemplary embodiment of the present disclosure may include: a multilayer ceramic capacitor 310 including a ceramic body 311 including dielectric layers 312, first and second internal electrodes 313a and 313b disposed in the ceramic body 311 so as to face each other with each of the dielectric layers 312 interposed therebetween, and first and second external electrodes 314a and 314b formed on both end portions of the ceramic body 311; an interposer 320 including an insulating board 321 having first and second main surfaces opposing each other in a thickness direction, first and second side surfaces opposing each other in a width direction, and third and fourth end surfaces opposing each other in a length direction, first and second connective electrodes 322a and 322b disposed on the first and second main surfaces of the insulating board 321 so as to be connected to the first and second external electrodes 314a and 314b on the first main surface, respectively, and a concave part 323 disposed so that at least one of the first and second side surfaces and third and fourth end surfaces are indented, when a length of a region including the insulating board and the connective electrodes is defined as L, and a width thereof is defined as W, the concave part 323 being disposed so that an area of the region including the insulating board 321 and the first and second connective electrodes 322a and 322b on the first main surface is smaller than L×W; and a board 330 including a first board electrode 331a connected to the first connection electrode 322a on the second main surface and a second board electrode 331b connected to the second connection electrode 322b on the second main surface.

A device mounted on the board 330 by the interposer 320 may be various, and examples thereof may include a multilayer ceramic capacitor, a semiconductor device, a R-HMC, or the like, but the present disclosure is not limited thereto. The electronic component including the multilayer ceramic capacitor 310 is shown in FIGS. 10 through 12, but the above-mentioned various devices may be included.

The board 330 on which the interposer 320 and the device are mounted may be a printed circuit board (PCB), or the like, but is not limited thereto. The board 330 may include various boards on which the device may be mounted.

The multilayer ceramic capacitor 310 according to the present exemplary embodiment may include the ceramic body 311, the dielectric layers 312, the first and second external electrodes 314a and 314b, and the first and second internal electrodes 313a and 313b.

The ceramic body 311 of the multilayer ceramic capacitor 310 may be formed by applying a conductive paste on ceramic green sheets so as to form the first and second internal electrodes 313a and 313b, stacking the ceramic green sheets on which the first and second internal electrodes 313a and 313b are formed, and then sintering the stacked ceramic green sheets. The multilayer ceramic capacitor 310 may be manufactured by forming the first and second external electrodes 314a and 314b on an outer portion of the ceramic body 311 so as to be electrically connected to the first and second internal electrodes 313a and 313b, respectively.

The board 330 according to the present exemplary embodiment may include the first and second board electrodes 331a and 331b and connected to the first and second connective electrodes 322a and 322b of the interposer 320, respectively.

Referring to FIGS. 10 through 12, the interposer 320 may be mounted on the board 330, and the multilayer ceramic capacitor 310 may be mounted on the interposer 320. The first and second external electrodes 314a and 314b of the multilayer ceramic capacitor 310 may be connected to the first and second connective electrodes 322a and 322b disposed on an upper surface of the interposer 320, respectively. Therefore, the first and second external electrodes 314a and 314b of the multilayer ceramic capacitor 310 may be electrically connected to the first and second board electrodes 331a and 331b disposed of the board 330.

The interposer 320 included in the board 300 having an electronic component including an interposer 320 according to the present exemplary embodiment may include the concave part 323.

As described above, when a rectangle of which a length of one side is L and a length of the other side is W is defined, an area of a region indented by the concave part 323 may be defined as A. In other words, A is a value obtained by subtracting an area of the first main surface of the interposer 320 from L×W, which is an area of the rectangle.

When A/(L×W) is less than 0.023, since an empty region formed by the concave 323 is small, a large amount of an adhesive such as solder, or the like, may be disposed on lower portions of the device and the interposer 320, and accordingly, an amount of the adhesive moving along a side surface of the device may be increased, such that a mounting defect may occur. When A/(L×W) is more than 0.321, since the adhesive such as the solder, or the like, may be disposed only at the empty region formed by the concave part 323, and may not be bonded to the side surface of the device, adhesion strength may be decreased, such that an electrode of the device, the first and second connective electrodes 322a and 322b of the interposer 320, or the like, may be delaminated or sheared. Therefore, in the case in which A/(L×W) satisfies 0.023≤A/(L×W)≤0.321, the interposer 320 having excellent mounting stability and adhesion strength may be obtained.

In addition, an area of the first and second connective electrodes 322a and 322b disposed on the first main surface of the interposer 320 may be defined as B.

When B/(L×W) is less than 0.227, since a bonding area between the first and second connective electrodes 322a and 322b of the interposer 320, and the adhesive such as the solder, or the like, on the board is decreased, adhesion strength may be decreased, such that the electrode of the device, the first and second connective electrodes 322a and 322b of the interposer 320, or the like, may be delaminated or sheared. When B/(L×W) is more than 0.538, since the empty region formed by the concave 323 is small, a large amount of the adhesive such as the solder, or the like, may be disposed on the lower portions of the device and the interposer 320, and accordingly, an amount of the adhesive moving along the side surface of the device may be increased, such that the mounting defect may occur. Therefore, in the case in which B/(L×W) satisfies 0.0227≤B/(L×W)≤0.538, the interposer 320 having excellent mounting stability and adhesion strength may be obtained.

A detailed description of 0.023≤A/(L×W)≤0.321 and 0.227≤B/(L×W)≤0.538 will be omitted in order to avoid an overlapped description.

Figure 13:
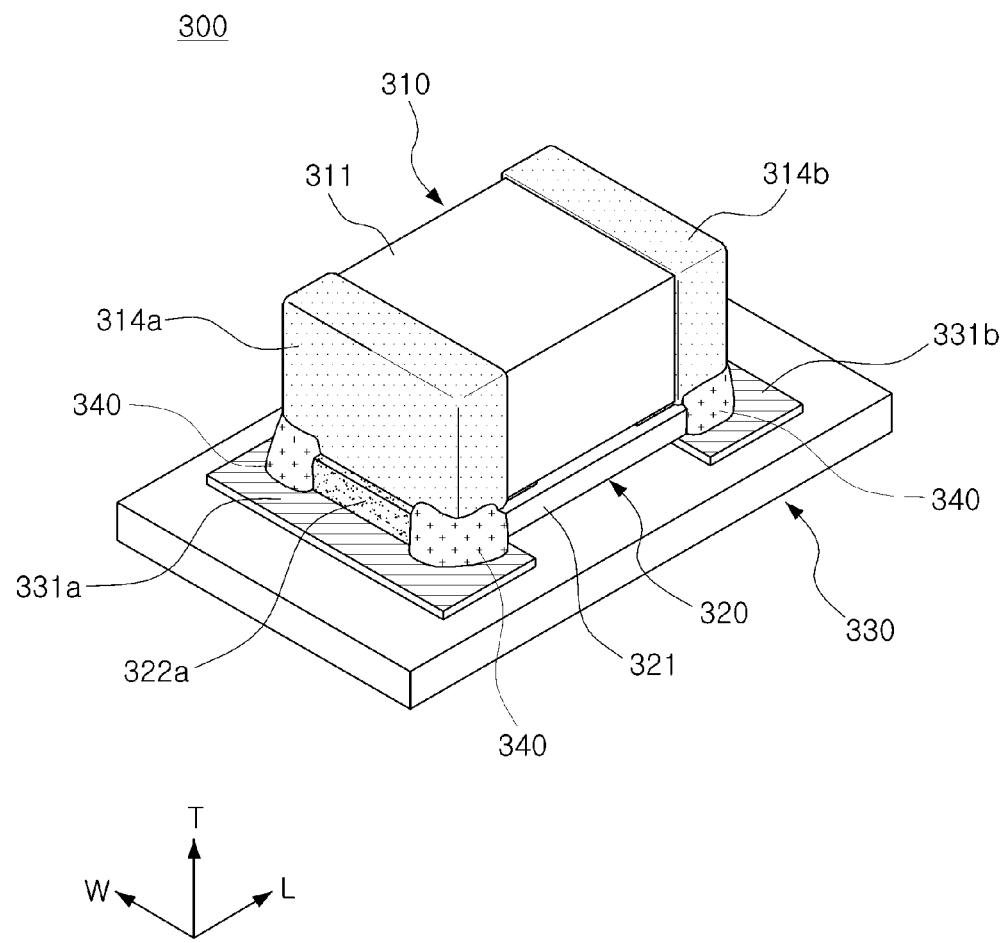
FIG. 13 is a perspective view of a board having an electronic component including an interposer according to a sixth exemplary embodiment of the present disclosure.

FIG. 13 is a perspective view of a board 300 having an electronic component including the interposer 320 according to a sixth exemplary embodiment of the present disclosure.

Referring to FIG. 13, the board 300 having an electronic component including an interposer 320 according to a sixth exemplary embodiment of the present disclosure may further include solder 340 disposed in the concave part 323.

As described above, the solder 340 may be used in order to bond the board 330, the interposer 320, and the device to each other. After forming the solder 340 on the first and second board electrodes 331a and 331b of the board 330 and disposing the interposer 320 and the device thereon, the board 330, the interposer 320, and the device may be bonded to each other by reflowing the solder 340.

The solder 340 may be disposed on a lower surface of the interposer 320, the region indented by the concave part 323, the first and second side surfaces or the third and fourth end surfaces of the interposer 320, and the side surface of the device by the reflow process.

As set forth above, according to exemplary embodiments of the present disclosure, the interposer, the electronic component including the same, and the board having an electronic component including the same may be provided, such that mounting stability and adhesion strength may be improved.

While exemplary embodiments have been shown and described above, it will be apparent to those skilled in the art that modifications and variations could be made without departing from the scope of the present invention as defined by the appended claims.

What is claimed is:

1. An interposer comprising: an insulating board having first and second main surfaces opposing each other in a thickness direction, first and second side surfaces opposing each other in a width direction, and third and fourth end surfaces opposing each other in a length direction; connective electrodes disposed on the first and second main surfaces of the insulating board; and a concave part disposed so that at least one of the first and second side surfaces and the third and fourth end surfaces are indented, wherein when a length of a region including the insulating board and the connective electrodes is defined as L, and a width thereof is defined as W, the concave part is disposed so that an area of the region including the insulating board and the connective electrodes on the first main surface is smaller than L×W, wherein when an area of a region indented by the concave part is defined as A, A/(L×W) satisfies 0.023≤A/(L×W) ≤0.321.

2. The interposer of claim 1, wherein when an area of the connective electrodes disposed on the first main surface is defined as B, B/(L×W) satisfies 0.227≤B/(L×W)≤0.538.

3. The interposer of claim 1, wherein the concave part is disposed at at least one corner of the insulating board.

4. The interposer of claim 1, wherein the concave part is disposed at at least one of the first and second side surfaces or the third and fourth end surfaces of the insulating board.

5. The interposer of claim 1, wherein the insulating board contains ceramic or a resin.

6. The interposer of claim 1, wherein the connection electrode is extended to at least one of the first and second side surfaces or the third and fourth end surfaces of the insulating board.

7. An electronic component comprising: a multilayer ceramic capacitor including a ceramic body including dielectric layers, first and second internal electrodes disposed in the ceramic body to face each other with respective dielectric layers interposed therebetween, and first and second external electrodes formed on both end portions of the ceramic body; and an interposer including an insulating board having first and second main surfaces opposing each other in a thickness direction, first and second side surfaces opposing each other in a width direction, and third and fourth end surfaces opposing each other in a length direction, first and second connective electrodes disposed on the first and second main surfaces of the insulating board so as to be connected to the first and second external electrodes on the first main surface, respectively, and a concave part disposed so that at least one of the first and second side surfaces and third and fourth end surfaces is indented, wherein when a length of a region including the insulating board and the first and second connective electrodes is defined as L, and a width thereof is defined as W, the concave part is disposed so that an area of the region including the insulating board and the first and second connective electrodes on the first main surface is smaller than L×W, wherein when an area of a region indented by the concave part is defined as A, A/(L×W) satisfies 0.023≤A/(L×W)≤0.321.

8. The electronic component of claim 7, wherein when an area of the connective electrodes disposed on the first main surface is defined as B, B/(L×W) satisfies 0.227≤B/(L×W) ≤0.538.

9. A board having an electronic component, the board comprising: a multilayer ceramic capacitor including a ceramic body including dielectric layers, first and second internal electrodes disposed in the ceramic body so as to face each other with respective dielectric layers interposed therebetween, and first and second external electrodes formed on both end portions of the ceramic body; an interposer including an insulating board having first and second main surfaces opposing each other in a thickness direction, first and second side surfaces opposing each other in a width direction, and third and fourth end surfaces opposing each other in a length direction, first and second connective electrodes disposed on the first and second main surfaces of the insulating board so as to be connected to the first and second external electrodes on the first main surface, respectively, and a concave part disposed so that at least one of the first and second side surfaces and third and fourth end surfaces is indented, when a length of a region including the insulating board and the first and second connective electrodes is defined as L, and a width thereof is defined as W, the concave part being disposed so that an area of the region including the insulating board and the first and second connective electrodes on the first main surface is smaller than L×W; and a board including a first board electrode connected to the first connection electrode on the second main surface and a second board electrode connected to the second connection electrode on the second main surface, wherein when an area of a region indented by the concave part is defined as A, A/(L×W) satisfies 0.023≤A/(L×W)≤0.321.

10. The board of claim 9, wherein when an area of the connective electrodes disposed on the first main surface is defined as B, B/(L×W) satisfies 0.227≤B/(L×W)≤0.538.

11. The board of claim 9, further comprising solder disposed in the concave part.

* * * * *